United States Patent
Cypher et al.

(10) Patent No.: US 8,255,741 B2
(45) Date of Patent: Aug. 28, 2012

(54) FACILITATING ERROR DETECTION AND CORRECTION AFTER A MEMORY COMPONENT FAILURE

(75) Inventors: Robert E. Cypher, Saratoga, CA (US); Bharat K. Daga, Fremont, CA (US)

(73) Assignee: Oracle America, Inc., Redwood Shores, CA (US)

( * ) Notice: Subject to any disclaimer, the term of this patent is extended or adjusted under 35 U.S.C. 154(b) by 677 days.

(21) Appl. No.: 12/494,506

(22) Filed: Jun. 30, 2009

(65) Prior Publication Data

US 2010/0332944 A1    Dec. 30, 2010

(51) Int. Cl.
*G11C 29/00*    (2006.01)
(52) U.S. Cl. .................. 714/6.11; 714/54; 714/766
(58) Field of Classification Search .............. 714/6.11, 714/54, 766
See application file for complete search history.

(56) References Cited

U.S. PATENT DOCUMENTS

| | | | | |
|---|---|---|---|---|
| 5,357,527 A * | 10/1994 | Coates et al. | .................. | 714/755 |
| 5,450,423 A * | 9/1995 | Iwasaki et al. | .................. | 714/767 |
| 5,535,227 A * | 7/1996 | Silvano | .................. | 714/766 |
| 5,550,849 A * | 8/1996 | Harrington | .................. | 714/752 |
| 5,563,894 A * | 10/1996 | Fujiwara et al. | .................. | 714/785 |
| 5,666,371 A * | 9/1997 | Purdham | .................. | 714/763 |
| 6,003,144 A * | 12/1999 | Olarig et al. | .................. | 714/42 |
| 6,024,486 A * | 2/2000 | Olarig et al. | .................. | 714/763 |
| 6,336,203 B1 * | 1/2002 | Yoshida | .................. | 714/785 |
| 7,188,296 B1 | 3/2007 | Cypher | | |

* cited by examiner

*Primary Examiner* — Stephen M Baker
(74) *Attorney, Agent, or Firm* — Park, Vaughan, Fleming & Dowler LLP

(57) ABSTRACT

Some embodiments of the present invention provide a system that can be reconfigured to provide error detection and correction after a failure of a memory component in a memory system. During operation, the system accesses a block of data from the memory system, wherein each block of data in the memory system includes an array of bits logically organized into R rows and C columns, including two checkbit columns containing checkbits, and C–2 data-bit columns containing data bits, wherein each column is stored in a different memory component, and wherein the checkbits are generated from the data bits to provide block-level detection and correction for a failed memory component. Next, upon examining the block of data, the system determines that a specific memory component in the memory system has failed. If the failed memory component contains a data-bit column for the block of data, the system uses checkbits from the two checkbit columns to correct the data-bit column, and then stores the corrected data-bit column. Next, the system generates and stores new checkbits in a functioning memory component, wherein the new checkbits provide single-error-correction and double-error-detection for erroneous bits in the block of data, but do not provide for detection and correction of a failed memory component.

20 Claims, 6 Drawing Sheets

FACILITATING ERROR DETECTION AND CORRECTION AFTER A MEMORY COMPONENT FAILURE

RELATED APPLICATION

The subject matter of this application is related to the subject matter in a co-pending non-provisional application by inventor Robert E. Cypher, filed on the same day as the instant application, entitled "Facilitating Probabilistic Error Detection and Correction After a Memory Component Failure," having Ser. No. 12/494,514, and filed on 30 Jun. 2009.

BACKGROUND

1. Field

The present invention generally relates to error detection and correction mechanisms in computer memories. More specifically, the present invention relates to a technique that facilitates error detection and error correction after a failure of a memory component in a computer system.

2. Related Art

Computer systems routinely employ error-detecting and error-correcting codes to detect and/or correct various data errors which can be caused, for example, by noisy communication channels and unreliable storage media. Some error codes, such as SECDED Hamming codes, can be used to correct single-bit errors and detect double-bit errors. Other codes, which are based on Galois fields, can be used to correct a special class of multi-bit errors caused by a failure of an entire memory component. (For example, see U.S. Pat. No. 7,188,296, entitled "ECC for Component Failures Using Galois Fields," by inventor Robert E. Cypher, filed 30 Oct. 2003, referred to as "the '296 patent.") After a memory component fails, it is desirable to be able to detect and correct additional errors that arise during subsequent computer system operation. The technique described in the '296 patent can correct subsequent single-bit errors. However, this technique cannot be used to detect subsequent double-bit errors. It is also desirable to be able to reduce the number of additional "checkbits" which are used by this technique to provide such error correction and detection.

Hence, what is needed is a method and an apparatus for detecting and correcting errors that arise after a memory component has failed without the shortcomings of existing techniques.

SUMMARY

Some embodiments of the present invention provide a system that can be reconfigured to provide error detection and correction after a failure of a memory component in a memory system. During operation, the system accesses a block of data from the memory system, wherein the memory system is previously determined to have a specific failed memory component. Each block of data in the memory system includes an array of bits logically organized into R rows and C columns, including two checkbit columns containing checkbits, and C−2 data-bit columns containing data bits. Moreover, each column is stored in a different memory component, and the checkbits are generated from the data bits to provide block-level detection and correction for a failed memory component. Next, if the failed memory component contains a data-bit column for the block of data, the system uses checkbits from the two checkbit columns to correct the data-bit column, and then stores the corrected data-bit column. Next, the system generates and stores new checkbits in a functioning memory component, wherein the new checkbits provide single-error-correction and double-error-detection for erroneous bits in the block of data, but do not provide for detection and correction of a failed memory component.

In some embodiments, the new checkbits are generated using an extended Hamming code which provides single-error-correction and double-error-detection for the block of data.

In some embodiments, the two checkbit columns include a row checkbit column and an inner checkbit column. The row checkbit column contains row-parity bits for each of the R rows in the block. In contrast, the inner checkbit column contains inner checkbits which are defined to cover bits in the array in accordance with a set of check vectors, wherein each check vector is associated with a different bit in the array and is an element of a Galois Field $GF(2^R)$. These check vectors are derived from a set of keys which are unique elements of $GF(2^R)$, wherein each key is associated with a different column of the array. The check vector for a row r of a column c is the product in $GF(2^R)$ of the key for the column c and $\alpha^r$, wherein $\alpha$ is a primitive element of $GF(2^R)$.

In some embodiments, determining that the memory component has failed involves: regenerating the row-parity bits and the inner checkbits for the block of data from the data bits in the block of data; comparing the regenerated row-parity bits and inner checkbits with the existing row-parity bits and inner checkbits in the block of data; and determining that the memory component has failed based on the comparison.

In some embodiments, comparing the regenerated row-parity bits and inner checkbits with the existing row-parity bits and inner checkbits involves: computing a row syndrome by exclusive-ORing the regenerated row-parity bits with the existing row-parity bits; computing an inner syndrome by exclusive-ORing the regenerated inner checkbits with the existing inner checkbits. If the row syndrome has multiple ones, which implies that a memory component has failed, the system uses the row syndrome and the inner syndrome to determine a key for a column associated with the failed memory component, and then compares the generated key against the set of keys to identify the failed memory component.

In some embodiments, generating the key for the column associated with the failed memory component involves performing a division operation in $GF(2^R)$ of the inner syndrome by the row syndrome to generate the key for the column associated with the failed memory component.

In some embodiments, determining the key for the column associated with the failed memory component involves: performing multiplication operations in $GF(2^R)$ between the row syndrome and each key in the set of keys, and comparing the inner syndrome against results of the multiplication operations. If the inner syndrome matches a result, the system determines that the key associated with the result is the key for the column associated with the failed memory component.

In some embodiments, correcting the data-bit column involves: attempting to correct the data-bit column by using the checkbits and the data bits in the block to produce a corrected data-bit column; regenerating the row-parity bits and the inner checkbits from the data bits in the array, including data bits from the corrected data-bit column, and comparing the regenerated row-parity bits and inner checkbits with existing row-parity bits and inner checkbits. If the comparison indicates that there remains a double-bit error wherein both erroneous bits are in the same row and one is in the column associated with the failed component, the system flips the erroneous bits to correct the double-bit error.

In some embodiments, attempting to correct the data-bit column to produce a corrected data-bit column involves: using the row syndrome to identify erroneous bits in the data-bit column associated with the failed memory component; and flipping the identified erroneous bits to produce the corrected data-bit column.

In some embodiments, CV(x, y) is the check vector associated with the bit at row x and column y of the array, and wherein the set of keys are selected so that for any two distinct rows $r_1$ and $r_2$ and any three distinct columns $c_1$, $c_2$, and $c_3$, $CV(r_1, c_1)$ XOR $CV(r_2, c_2)$ XOR $CV(r_1, C_3)$ XOR $CV(r_2, C_3)$ is not equal to zero.

In some embodiments, a key associated with a column $c_y$ is denoted as key($c_y$), wherein the set of keys are selected so that for any row r, and for any three distinct columns $c_1$, $c_2$ and $c_3$, key($c_1$) XOR key($c_2$) is not equal to the product in $GF(2^R)$ of key($c_1$) XOR key($c_3$) and $\alpha^r$.

In some embodiments, a first key in the set of keys associated with the row checkbit column is all zeros; and a second key in the set of keys associated with the inner checkbit column is all zeros except for a one in the least significant position.

In some embodiments, each data block contains a cache line or a portion of a cache line.

Some embodiments of the present invention provide a system that provides error detection and correction after a failure of a memory component in a memory system. During operation, the system accesses a block of data from the memory system, wherein the memory system is previously determined to have a specific failed memory component. Each block of data in the memory system includes an array of bits logically organized into R rows and C columns, including a row checkbit column including row-checkbits for each of the R rows, an inner checkbit column including X<R inner checkbits and R−X data bits, and C−2 data-bit columns containing data bits. Note that each column is stored in a different memory component, and the checkbits are generated from the data bits to provide block-level detection and correction for a failed memory component. Next, the system attempts to correct a column of the block from the failed memory component by using the checkbits and the data bits to produce a corrected column. The system then regenerates the row-parity bits and the inner checkbits for the block of data, wherein the block includes the corrected column, and compares the regenerated row-parity bits and inner checkbits with existing row-parity bits and inner checkbits. If the comparison indicates that there remains a double-bit error wherein both erroneous bits are in the same row and one is in the column associated with the failed component, the system flips the erroneous bits to correct the double-bit error.

In some embodiments, the row checkbit column contains row-parity bits for each of the R rows in the block, and the inner checkbit column contains X<R inner checkbits which are defined to cover bits in the array in accordance with a set of check vectors. Each of these check vectors is associated with a different bit in the array and is an element of a Galois Field ($GF(2^X)$). Moreover, the check vectors are derived from a set of keys which are unique elements of $GF(2^X)$, wherein each key is associated with a different column of the array, and wherein the check vector for a row r of a column c is the product in $GF(2^X)$ of the key for the column c and $\alpha^r$ wherein $\alpha$ is a primitive element of $GF(2^X)$.

In some embodiments, the set of keys are elements of a subfield of $G(2^X)$, wherein the subfield does not contain any $\alpha^i$, where $1 \leq i \leq R$.

In some embodiments, attempting to correct the column from the failed memory component involves: regenerating the row-parity bits and the inner checkbits for the block of data from the data bits in the block of data; computing a row syndrome by exclusive-ORing the regenerated row-parity bits with the existing row-parity bits; computing an inner syndrome by exclusive-ORing the regenerated inner checkbits with the existing inner checkbits; using the row syndrome to identify erroneous bits in the data-bit column associated with the failed memory component; and flipping the identified erroneous bits to produce the corrected data-bit column.

In some embodiments, prior to accessing the block of data, the system generates the set of keys associated with the columns so that key$_0$=0, and for each i, $1 \leq i \leq C-1$, key$_i = \alpha \hat{} ((2^{(X/2)}+1)j)$, wherein j is a unique integer for each value of i and X is an even integer.

DETAILED DESCRIPTION

Figure 1:
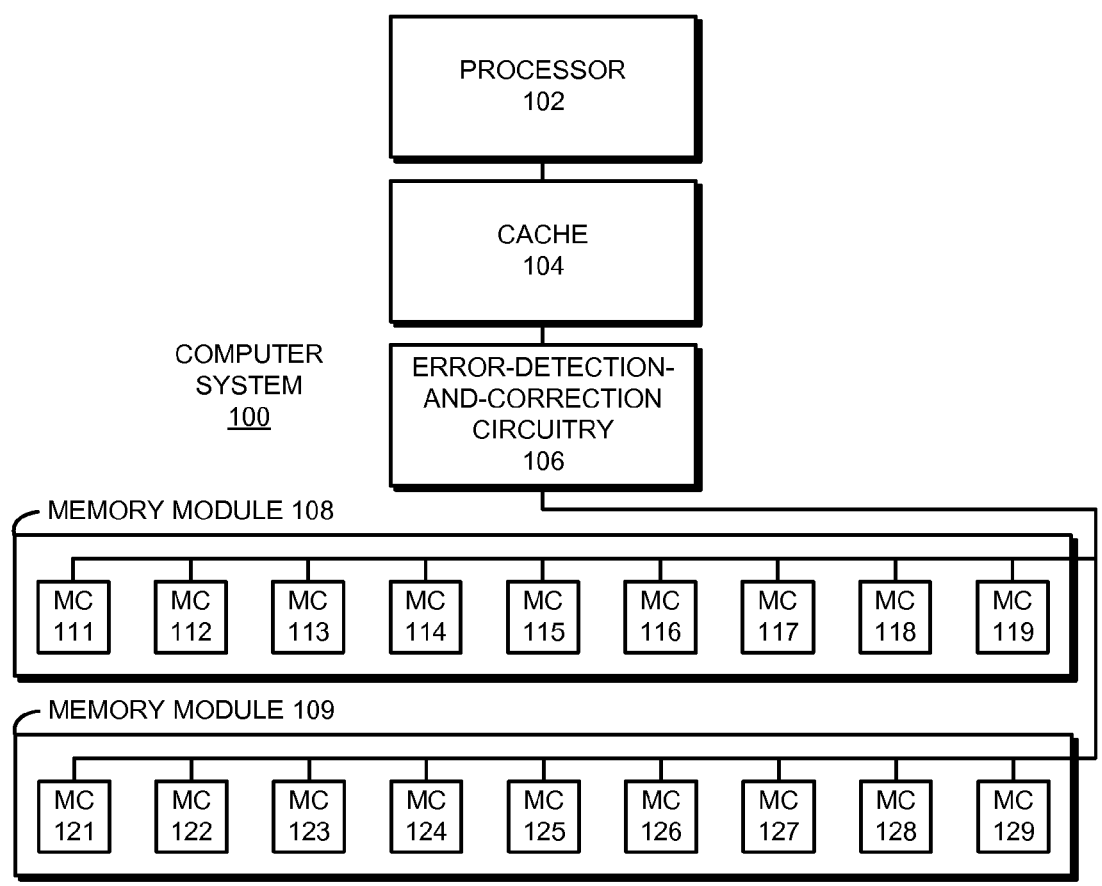
FIG. 1 illustrates a computer system in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

One embodiment of the present invention provides a mechanism for detecting and correcting multi-bit errors caused by the failure of a communication or memory component (such as the failure of a DRAM chip). In addition, the embodiment can correct single-bit errors and detect double-bit errors once a failed component has been identified and the ECC has been re-encoded. This embodiment corrects all component failures and detects all double-bit errors. In addition, once a failed component has been identified, the ECC is re-encoded so that, in addition to correcting all errors in the failed component and any single-bit error in any other component, it detected any double-bit error across any of the other components.

One embodiment of the present invention accesses blocks of data (e.g., cache lines). Each block of data is logically organized into C sets of R bits, which can be viewed as forming an array with R rows and C columns, such that the bits affected by the failure of a single component are located in a single column. For example, if 576 bits are stored on 18 DRAM chips, with 32 bits per DRAM, the bits can be viewed as forming a 32×18 array, wherein the bits stored on a single DRAM comprise a single column of the array. In this example, the rows are numbered 0 through R−1 and the columns are numbered 0 through C−1.

Column 0 and column 1 include checkbits. More specifically, column 0 contains "row-parity checkbits," wherein the row-parity checkbit stored in position (r, 0) is the even parity of the bits stored in positions (r, c), where $1 \leq c \leq C-1$. Column 1 contains inner checkbits. Note that the inner checkbits in the initial encoding are described in U.S. Pat. No. 7,188,296, entitled "ECC for Component Failures Using Galois Fields," by inventor Robert E. Cypher, filed 30 Oct. 2003, which is hereby incorporated by reference to provide details about this initial encoding. Specifically, the embodiment uses R inner checkbits where inner checkbit i, $0 \leq i \leq R$, is stored in position (i, 1). Associated with each column c, $0 \leq c \leq C-1$, is a unique key, keys, which is a member of the Galois Field $GF(2^R)$. Each inner checkbit is the even parity of a subset of the R*C bits in a block. Specifically, the bit in location (r, c), is in the subset of bits covered by inner checkbit i, $0 \leq i \leq R-1$, iff bit i of $(key_c * \alpha^r)=1$, where the multiplication is in $GF(2^R)$ and $\alpha$ is a primitive element of $GF(2^R)$.

Correction of component failure errors can be accomplished whenever the inner syndrome is nonzero by dividing (in $GF(2^R)$) the row syndrome by the inner syndrome to produce $key_c$, where c is the column containing the error. In practice, division in $GF(2^R)$ is difficult to perform in hardware, so it is also possible to simply guess (in parallel) that each column contains the error, calculate the inner syndrome that results from that guess, and check the calculated inner syndrome against the true inner syndrome. The keys for the columns can be selected as described in U.S. Pat. No. 7,188,296.

In addition, once a failed component has been identified, SEC (single-error correction) can be performed to correct any additional errors that exist in the block by first using the above-described technique to attempt to correct the failed component. At this point, if there was a single-bit error in the original data (in addition to the component error), there is now a double-bit error where both bits in error are in the same row and one is in the column corresponding to the failed component (this second error is "projected" into the failed component by the attempt to correct the failed component). Next, the system calculates the inner syndrome of the resulting data and if it is nonzero, corrects these remaining two errors by flipping those bits that yield this unique nonzero inner syndrome (assuming the given failed component).

Once a failed component has been identified, the ECC can be re-encoded as follows. If the failed memory component contains a data-bit column for the block of data, the system uses checkbits from the two checkbit columns to produce a corrected data-bit column. This corrected data-bit column can then be stored in place of one of the checkbit columns. Next, the system generates new checkbits, wherein the new checkbits contain an extended Hamming code, which provides single-error-correction and double-error-detection for erroneous bits in the block of data, but does not provide for detection and correction of a failed memory component. These new checkbits can be stored in place of the other checkbit column (which was not used to store the corrected data-bit column)

On the other hand, if the failed component contained one of the checkbit columns, the system generates the extended Hamming code and stores it in place of the other non-failed checkbit column. For this case, the system does not have to regenerate the failed checkbit column.

The above-described technique is described in more detail below, but first we describe an exemplary computer system.

Computer System

FIG. 1 illustrates a computer system 100 in accordance with an embodiment of the present invention. Computer system 100 can generally include any type of computer system, including, but not limited to, a computer system based on a microprocessor, a mainframe computer, a digital signal processor, a portable computing device, a personal organizer, a cell phone, a device controller, or a computational engine within an appliance. Computer system 100 includes at least one processor 102, a cache memory 104, error-detection-and-correction circuitry 106 and memory modules 108 and 109. Processor 102 can include any type of computational engine that executes code and manipulates data. Cache memory 104 can include one or more caches or levels of caches, which store blocks of data (cache lines) which have recently been accessed or are likely to be accessed in the near future.

Error-detection-and-correction circuitry 106 includes circuitry that performs error correction and error detection operations for blocks of data which are retrieved from memory modules 108-109 and which are stored in cache memory 104. Note that the error-correction and error detection operations can additionally (or alternatively) be performed when blocks of data in cache memory 104 are accessed by processor 102 from cache memory 104. One embodiment of the error-detection-and-correction circuitry 106 is described in U.S. Pat. No. 7,188,296, entitled "ECC for Component Failures Using Galois Fields," by inventor Robert E. Cypher, filed 30 Oct. 2003, which is hereby incorporated by reference to provide details about how to implement such circuitry.

Memory modules 108 and 109 include memory components, which can be semiconductor chips containing random-access memory. More specifically, memory module 108 includes memory components (MCs) 111-119 and memory module 109 includes MCs 121-129.

Handling a Failure by Re-Encoding

Figure 2:
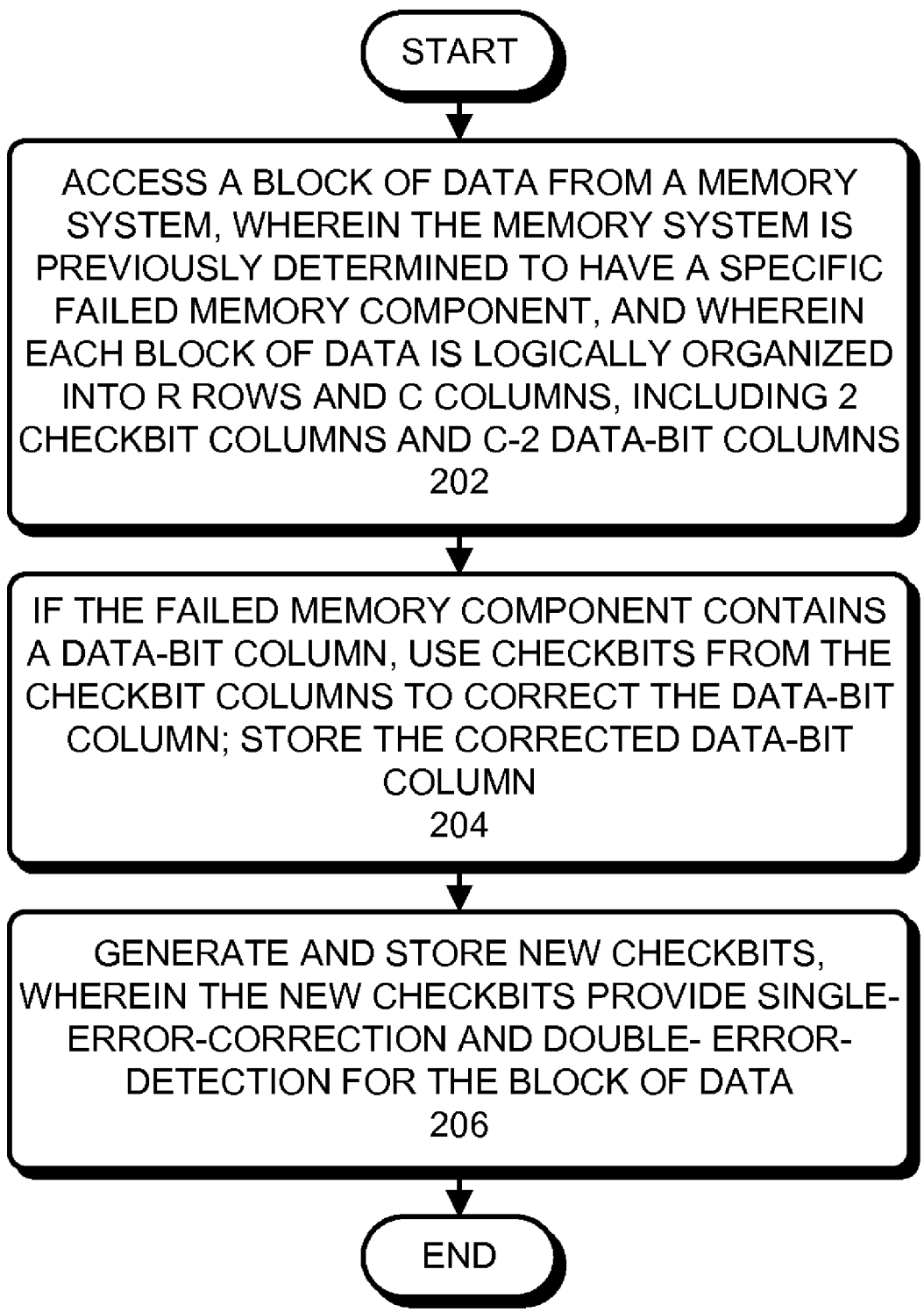
FIG. 2 presents a flow chart illustrating the process of dealing with a failure of a memory component during a memory access in accordance with an embodiment of the present invention.

FIG. 2 presents a flow chart illustrating the process of dealing with a failure of a memory component in accordance with an embodiment of the present invention. During operation, the system accesses a block of data from the memory system, wherein the memory system is previously determined to have a specific failed memory component. Each block of data in the memory system includes an array of bits logically organized into R rows and C columns, including two checkbit columns containing checkbits, and C−2 data-bit columns containing data bits. Moreover, each column is stored in a different memory component, and the checkbits are generated from the data bits to provide block-level detection and correction for a failed memory component (step 202).

Next, if the failed memory component contains a data-bit column for the block of data, the system uses checkbits from the two checkbit columns to correct the data-bit column, and stores the corrected data-bit column (step 204). For example, the new checkbits can be generated using an extended Hamming code which provides single-error-correction and double-error-detection for the block of data.

Next, the system generates and stores new checkbits in a functioning memory component, wherein the new checkbits provide single-error-correction and double-error-detection for erroneous bits in the block of data, but do not provide for detection and correction of a failed memory component (step 206).

Figure 3:
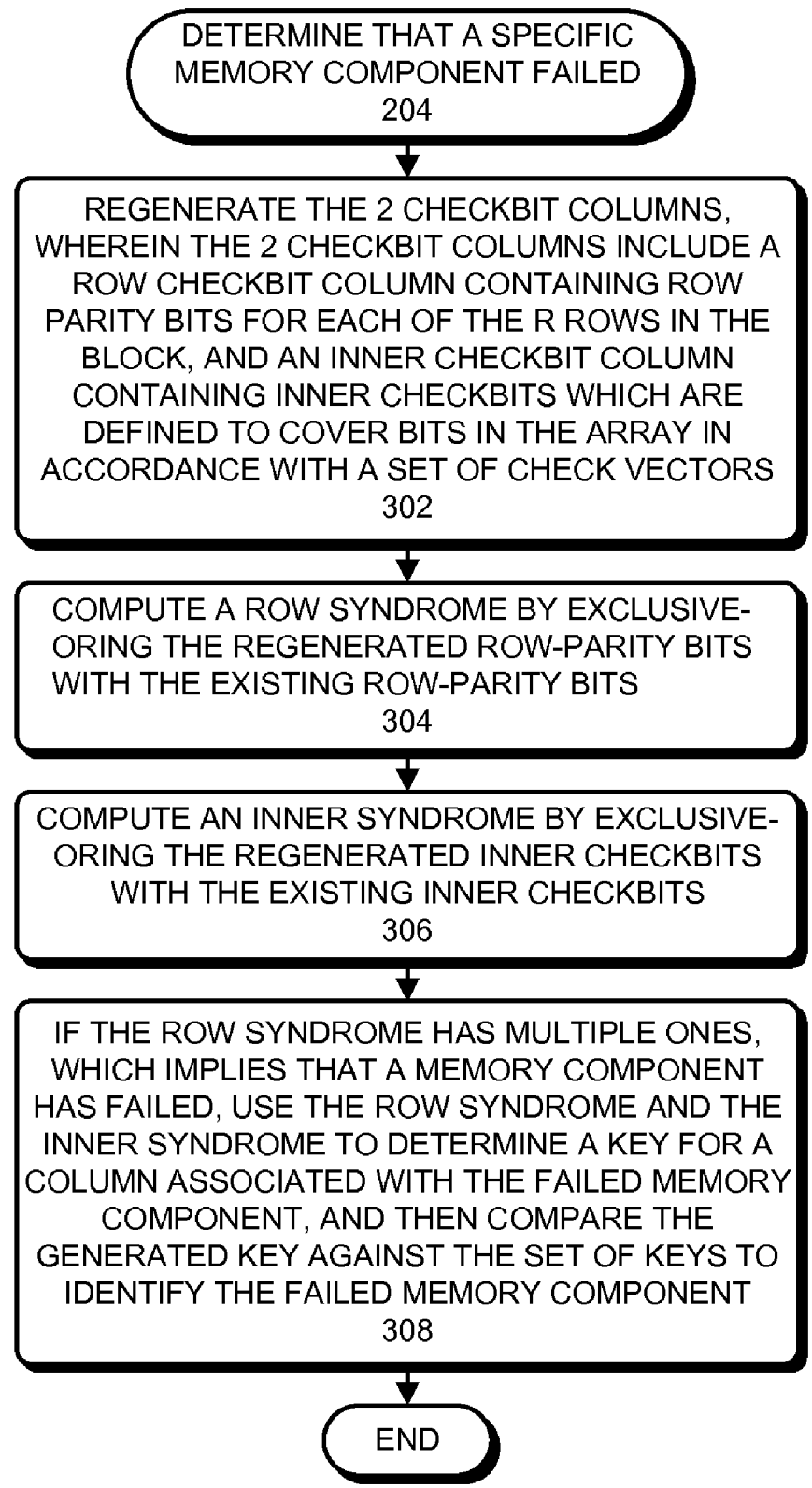
FIG. 3 presents a flow chart illustrating how a failure of a memory component is detected in accordance with an embodiment of the present invention.

FIG. 3 presents a flow chart illustrating how a failure of a memory component is detected in accordance with an embodiment of the present invention. In this embodiment, determining that the memory component has failed involves first regenerating the row-parity bits and the inner checkbits for the block of data from the data bits in the block of data (step 302). Next, the system computes a row syndrome by exclusive-ORing the regenerated row-parity bits with the existing row-parity bits (step 304). The system also computes an inner syndrome by exclusive-ORing the regenerated inner checkbits with the existing inner checkbits (step 306). Next, if the row syndrome has multiple ones, which implies that a memory component has failed, the system uses the row syndrome and the inner syndrome to determine a key for a column associated with the failed memory component, and then compares the generated key against the set of keys to identify the failed memory component (step 308).

Figure 4:
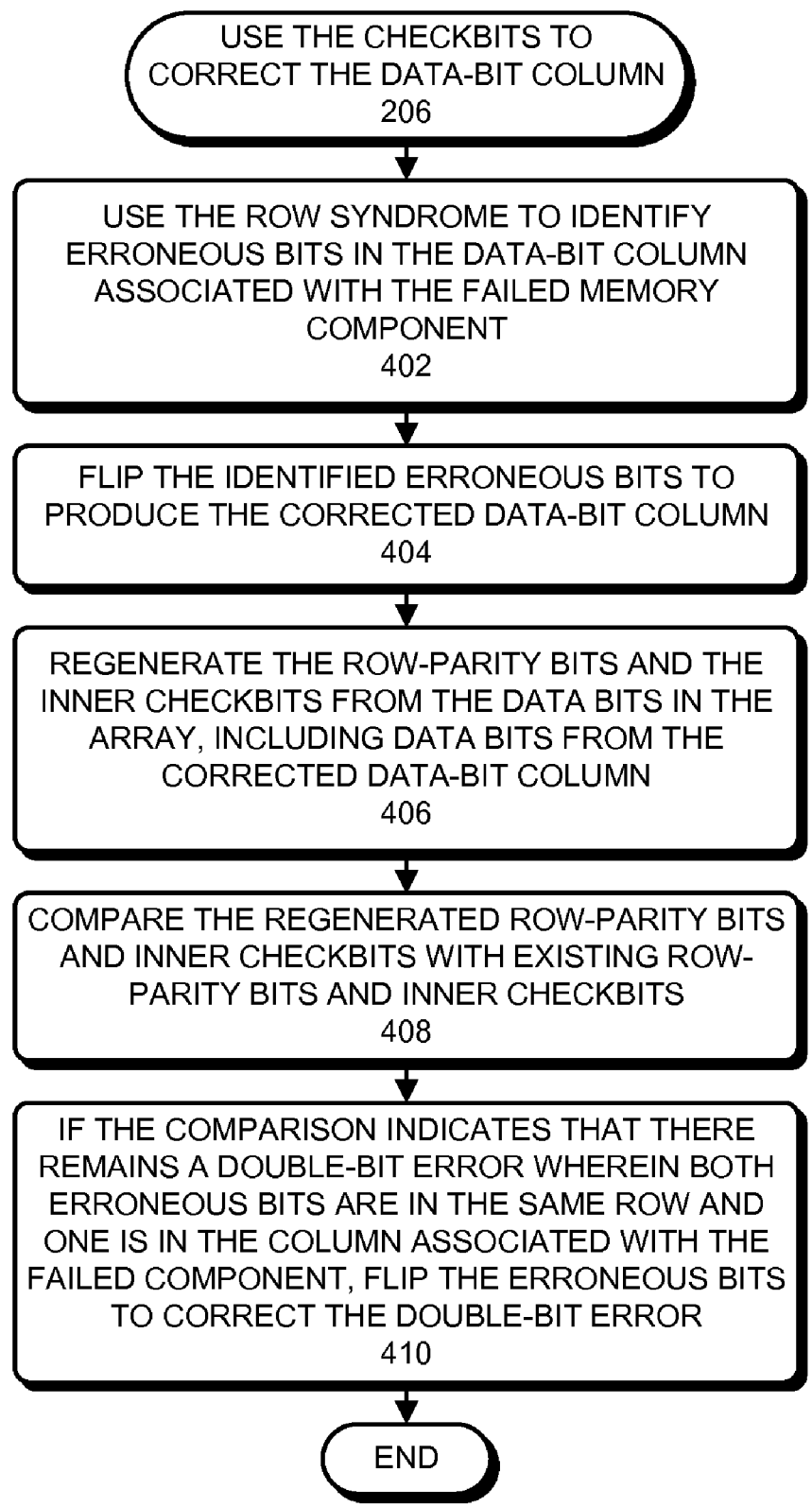
FIG. 4 presents a flow chart illustrating how a data-bit column is corrected in accordance with an embodiment of the present invention.

FIG. 4 presents a flow chart illustrating how a data-bit column is corrected (in step 206 in FIG. 2) in accordance with an embodiment of the present invention. First, the system uses the row syndrome to identify erroneous bits in the data-bit column associated with the failed memory component (step 402). The system then flips the identified erroneous bits to produce the corrected data-bit column (step 404). After the data-bit column is corrected, the system regenerates the row-parity bits and the inner checkbits from the data bits in the array, including data bits from the corrected data-bit column (step 406). Then, the system compares the regenerated row-parity bits and inner checkbits with existing row-parity bits and inner checkbits (step 408). If the comparison indicates that there remains a double-bit error wherein both erroneous bits are in the same row and one is in the column associated with the failed component, the system flips the erroneous bits to correct the double-bit error (step 410). Note that this subsequent detection of a double-bit error can be accomplished by comparing the inner syndrome against a pre-computed set of inner syndromes for all possible double-bit errors of this type.

Handling a Failure Using Fewer Checkbits

Figure 5:
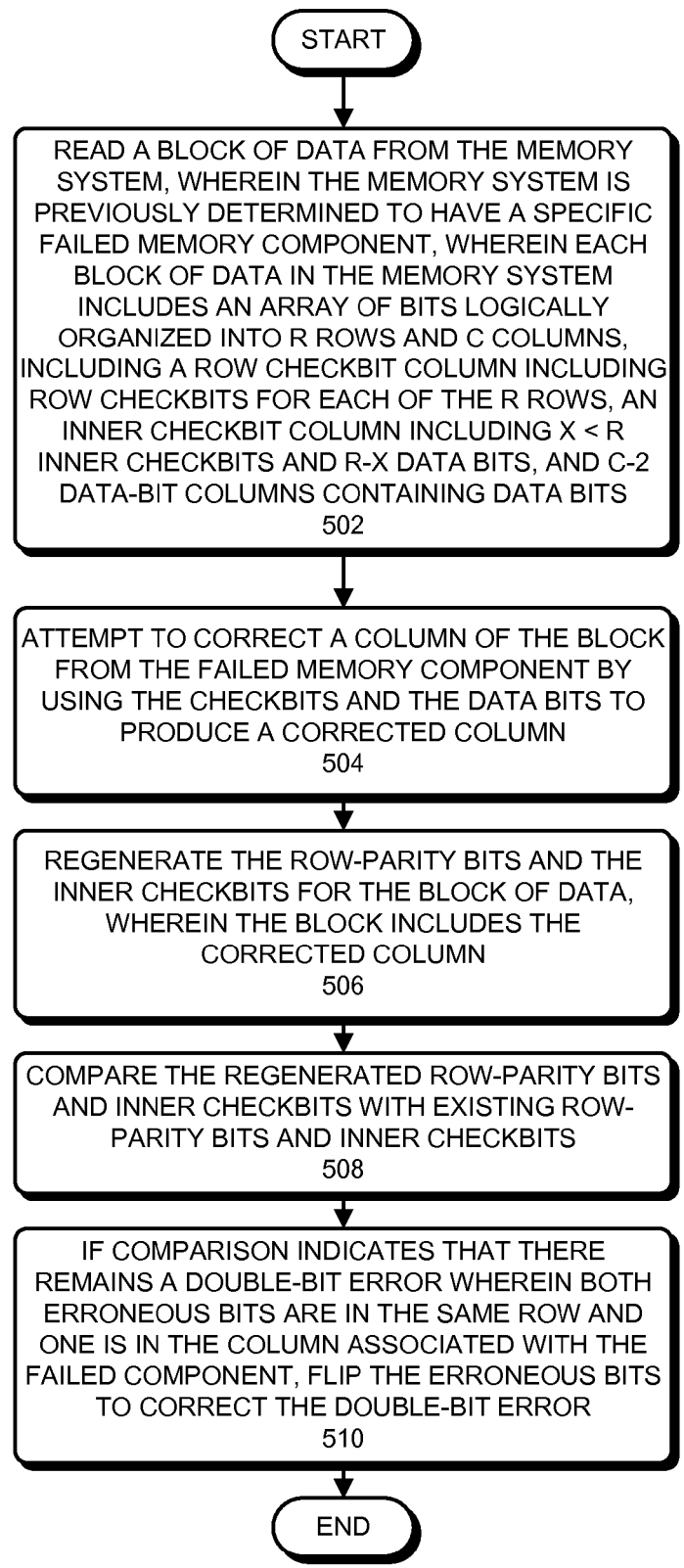
FIG. 5 presents a flow chart illustrating the process of accessing a block of data after a failure in a memory component in accordance with an embodiment of the present invention.

FIG. 5 presents a flow chart illustrating the process of accessing a block of data after a failure in a memory component, wherein the system uses fewer inner checkbits. During this process, the system accesses a block of data from the memory system (step 502). In this example, the memory system is previously determined to have a specific failed memory component, and each block of data in the memory system includes an array of bits logically organized into R rows and C columns, including a row checkbit column including row-checkbits for each of the R rows, an inner checkbit column including X<R inner checkbits and R−X data bits, and C−2 data-bit columns containing data bits (step 502).

Next, the system attempts to correct a column of the block from the failed memory component by using the checkbits and the data bits to produce a corrected column (step 504). The system then regenerates the row-parity bits and the inner checkbits for the block of data, wherein the block includes the corrected column (step 506), and then compares the regenerated row-parity bits and inner checkbits with existing row-parity bits and inner checkbits (step 508). If the comparison indicates that there remains a double-bit error wherein both erroneous bits are in the same row and one is in the column associated with the failed component, the system flips the erroneous bits to correct the double-bit error (step 510). As discussed above, this can be accomplished by comparing the inner syndrome against a pre-computed set of inner syndromes for all possible double-bit errors of this type.

Figure 6:
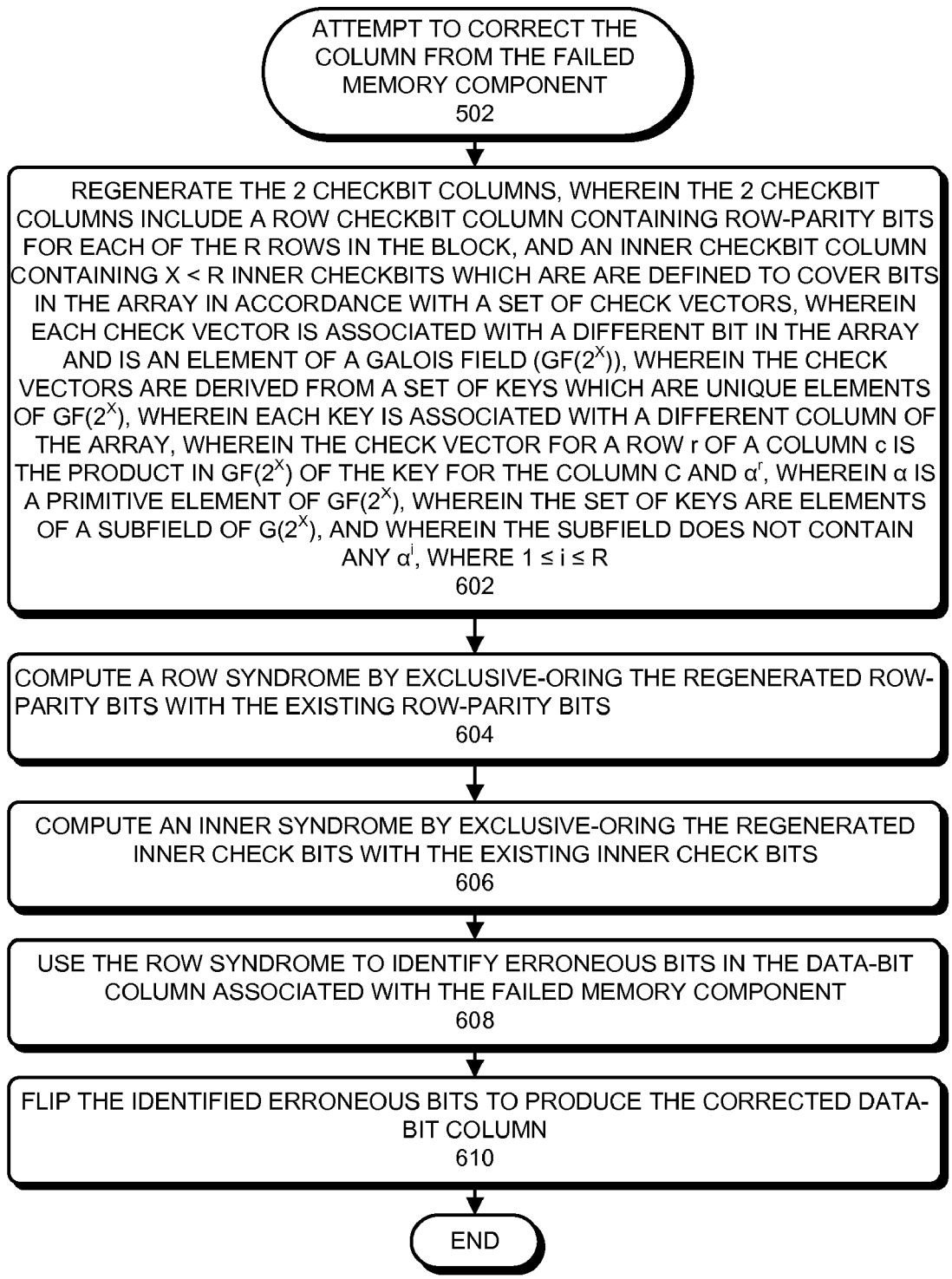
FIG. 6 presents a flow chart illustrating how a column is corrected in accordance with an embodiment of the present invention.

FIG. 6 presents a flow chart illustrating how a column is corrected (in step 502 in FIG. 1) in accordance with an embodiment of the present invention. First, the system regenerates the row-parity bits and the inner checkbits for the block of data from the data bits in the block of data (step 602). Next, the system computes a row syndrome by exclusive-ORing the regenerated row-parity bits with the existing row-parity bits (step 604), and computes an inner syndrome by exclusive-ORing the regenerated inner checkbits with the existing inner checkbits (step 606). Next, the system uses the row syndrome to identify erroneous bits in the data-bit column associated with the failed memory component (step 608). The system then flips the identified erroneous bits to produce the corrected data-bit column (step 610).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for reconfiguring a memory system to provide error detection and correction after a failure of a memory component, comprising:

accessing a block of data from the memory system, wherein the memory system is previously determined to have a specific failed memory component, wherein each block of data in the memory system includes an array of bits logically organized into R rows and C columns, including two checkbit columns containing checkbits, and C−2 data-bit columns containing data bits, wherein each column is stored in a different memory component, and wherein the checkbits are generated from the data bits to provide block-level detection and correction for a failed memory component;

if the failed memory component contains a data-bit column for the block of data, using checkbits from the two checkbit columns to correct the data-bit column, and to store the corrected data-bit column; and generating and storing new checkbits, wherein the new checkbits provide single-error-correction and double-error-detection for erroneous bits in the block of data, but do not provide for detection and correction of a failed memory component.

2. The method of claim 1, wherein the new checkbits are generated using an extended Hamming code which provides single-error-correction and double-error-detection for the block of data.

3. The method of claim 1, wherein each data block contains a cache line or a portion of a cache line.

4. The method of claim 1,
wherein the two checkbit columns include a row checkbit column and an inner checkbit column;
wherein the row checkbit column contains row-parity bits for each of the R rows in the block; and
wherein the inner checkbit column contains inner checkbits which are defined to cover bits in the array in accordance with a set of check vectors, wherein each check vector is associated with a different bit in the array and is an element of a Galois Field ($GF(2^R)$), wherein the check vectors are derived from a set of keys which are unique elements of $GF(2^R)$, wherein each key is associated with a different column of the array, and wherein the check vector for a row r of a column c is the product in $GF(2^R)$ of the key for the column c and $\alpha^r$, wherein $\alpha$ is a primitive element of $GF(2^R)$.

5. The method of claim 4,
wherein a first key in the set of keys associated with the row checkbit column is all zeros; and
wherein a second key in the set of keys associated with the inner checkbit column is all zeros except for a one in the least significant position.

6. The method of claim 4, wherein previously determining that the specific memory component has failed involves:
regenerating the row-parity bits and the inner checkbits for the block of data from the data bits in the block of data;
comparing the regenerated row-parity bits and inner checkbits with the existing row-parity bits and inner checkbits in the block of data; and
determining that the memory component has failed based on the comparison.

7. The method of claim 6, wherein comparing the regenerated row-parity bits and inner checkbits with the existing row-parity bits and inner checkbits involves:
computing a row syndrome by exclusive-ORing the regenerated row-parity bits with the existing row-parity bits;
computing an inner syndrome by exclusive-ORing the regenerated inner checkbits with the existing inner checkbits; and
if the row syndrome has multiple ones, which implies that a memory component has failed, using the row syndrome and the inner syndrome to determine a key for a column associated with the failed memory component, and then comparing the determined key against the set of keys to identify the failed memory component.

8. The method of claim 7, wherein determining the key for the column associated with the failed memory component involves performing a division operation in $GF(2^R)$ of the inner syndrome by the row syndrome to determine the key for the column associated with the failed memory component.

9. The method of claim 7, wherein determining the key for the column associated with the failed memory component involves:
performing multiplication operations in $GF(2^R)$ between the row syndrome and each key in the set of keys;
comparing the inner syndrome against results of the multiplication operations; and
if the inner syndrome matches a result, determining that the key associated with the result is the key for the column associated with the failed memory component.

10. The method of claim 7, wherein for the case where the failed memory component contains a data-bit column, correcting the data-bit column involves:
attempting to correct the data-bit column by using the checkbits and the data bits in the block to produce a corrected data-bit column;
regenerating the row-parity bits and the inner checkbits from the data bits in the array, including data bits from the corrected data-bit column;
comparing the regenerated row-parity bits and inner checkbits with existing row-parity bits and inner checkbits; and
if the comparison indicates that there remains a double-bit error wherein both erroneous bits are in the same row and one is in the column associated with the failed component, flipping the erroneous bits to correct the double-bit error.

11. The method of claim 10, wherein attempting to correct the data-bit column to produce a corrected data-bit column involves:
using the row syndrome to identify erroneous bits in the data-bit column associated with the failed memory component; and
flipping the identified erroneous bits to produce the corrected data-bit column.

12. The method of claim 10, wherein $CV(x, y)$ is the check vector associated with the bit at row x and column y of the array, and wherein the set of keys are selected so that for any two distinct rows $r_1$ and $r_2$ and any three distinct columns $c_1$, $c_2$, and $C_3$, $CV(r_1, c_1)$ XOR $CV(r_2, c_2)$ XOR $CV(r_1, C_3)$ XOR $CV(r_2, c_3)$ is not equal to zero.

13. The method of claim 10, wherein a key associated with a column $c_y$ is denoted as $key(c_y)$, and wherein the set of keys are selected so that for any row r, and for any three distinct columns $c_1$, $c_2$ and $c_3$, $key(c_1)$ XOR $key(c_2)$ is not equal to the product in $GF(2^R)$ of $key(c_1)$ XOR $key(c_3)$ and $\alpha^r$.

14. A memory system that reconfigures to provide error detection and correction after a failure of a memory component, comprising:
an access mechanism configured to access a block of data from the memory system, wherein the memory system is previously determined to have a specific failed memory component, wherein each block of data in the memory system includes an array of bits logically organized into R rows and C columns, including two checkbit columns containing checkbits, and C−2 data-bit columns containing data bits, wherein each column is stored in a different memory component, and wherein the checkbits are generated from the data bits to provide block-level detection and correction for a failed memory component; and
an error-handling circuit, wherein if the failed memory component contains a data-bit column for the block of data, the error-handling circuit is configured to use checkbits from the two checkbit columns to correct the data-bit column, and to store the corrected data-bit column; and
wherein the error-handling circuit is also configured to generate and store new checkbits, wherein the new checkbits provide single-error-correction and doubleerror-detection for erroneous bits in the block of data, but do not provide for detection and correction of a failed memory component.

15. The memory system of claim 14, wherein the new checkbits are generated using an extended Hamming code which provides single-error-correction and double-error-detection for the block of data.

16. The memory system of claim 14,
wherein the two checkbit columns include a row checkbit column and an inner checkbit column;
wherein the row checkbit column contains row-parity bits for each of the R rows in the block; and
wherein the inner checkbit column contains inner checkbits which are defined to cover bits in the array in accordance with a set of check vectors, wherein each check vector is associated with a different bit in the array and is an element of a Galois Field ($GF(2^R)$), wherein the check vectors are derived from a set of keys which are unique elements of $GF(2^R)$, wherein each key is associated with a different column of the array, and wherein the check vector for a row r of a column c is the product in $GF(2^R)$ of the key for the column c and $\alpha^r$, wherein $\alpha$ is a primitive element of $GF(2^R)$.

17. The memory system of claim 16, wherein while previously determining that the specific memory component has failed, the error-handling circuit is configured to:
regenerate the row-parity bits and the inner checkbits for the block of data from the data bits in the block of data;
compare the regenerated row-parity bits and inner checkbits with the existing row-parity bits and inner checkbits in the block of data; and
determine that the memory component has failed based on the comparison.

18. The memory system of claim 17, wherein while comparing the regenerated row-parity bits and inner checkbits with the existing row-parity bits and inner checkbits, the error-handling circuit is configured to:
compute a row syndrome by exclusive-ORing the regenerated row-parity bits with the existing row-parity bits;
compute an inner syndrome by exclusive-ORing the regenerated inner checkbits with the existing inner checkbits; and
if the row syndrome has multiple ones, which implies that a memory component has failed, use the row syndrome and the inner syndrome to determine a key for a column associated with the failed memory component, and then compare the determined key against the set of keys to identify the failed memory component.

19. The memory system of claim 18, wherein for the case where the failed memory component contains a data-bit column, while correcting the data-bit column the error-handling circuit is configured to:
attempt to correct the data-bit column by using the checkbits and the data bits in the block to produce a corrected data-bit column;
regenerate the row-parity bits and the inner checkbits from the data bits in the array, including data bits from the corrected data-bit column;
compare the regenerated row-parity bits and inner checkbits with existing row-parity bits and inner checkbits; and
if the comparison indicates that there remains a double-bit error wherein both erroneous bits are in the same row and one is in the column associated with the failed component, flip the erroneous bits to correct the double-bit error.

20. A computer system that reconfigures to provide error detection and correction after a failure of a memory component, comprising:
a processor;
a memory system;
an access mechanism within the memory system configured to access a block of data from the memory system, wherein each block of data in the memory system includes an array of bits logically organized into R rows and C columns, including two checkbit columns containing checkbits, and C−2 data-bit columns containing data bits, wherein each column is stored in a different memory component, and wherein the checkbits are generated from the data bits to provide block-level detection and correction for a failed memory component; and
an error-handling circuit within the memory system, wherein the error-handling circuit is configured to determine that a specific memory component in the memory system has failed;
wherein if the failed memory component contains a data-bit column for the block of data, the error-handling circuit is configured to use checkbits from the two checkbit columns to correct the data-bit column, and to store the corrected data-bit column; and
wherein the error-handling circuit is additionally configured to generate and store new checkbits, wherein the new checkbits provide single-error-correction and double-error-detection for erroneous bits in the block of data, but do not provide for detection and correction of a failed memory component.

* * * * *